Sept. 26, 1972 H. NELSON 3,694,275

METHOD OF MAKING LIGHT EMITTING DIODE

Filed March 12, 1969

INVENTOR
Herbert Nelson

BY Robert P. Williams
ATTORNEY 3,694,275

METHOD OF MAKING LIGHT EMITTING DIODE

Herbert Nelson, Princeton, N.J., assignor to RCA Corporation

Filed Mar. 12, 1969, Ser. No. 806,425
Int. Cl. H01l 7/38, 3/00; H05b 33/00
U.S. Cl. 148—171 3 Claims

ABSTRACT OF THE DISCLOSURE

Monocrystalline gallium arsenide of N type conductivity is made by liquid phase growth of a silicon doped epitaxial layer on a gallium arsenide substrate having a (111)-arsenic face as the growth promoting surface.

BACKGROUND OF THE INVENTION

This invention relates to a method of making a body of monocrystalline gallium arsenide and to the material fabricated by this method.

Semiconductive gallium arsenide wafers used in the manufacture of such devices as injection lasers are usually cut from a single crystal boule grown from a melt by the well known Czochralski technique. Another widely used method is that described by P. W. Bridgman, Proceedings of the American Academy of Arts and Sciences, volume 60, page 305, 1925. Such wafers often contain crystalline imperfections and these imperfections found to be detrimental to the operation of devices fabricated therefrom. In the fabrication of gallium arsenide laser diodes, it is common practice to select wafers of high crystalline quality. Even so, laser diodes manufactured with such material have degraded in their operation after being used for a relatively short period of time. For example, the power output of a laser diode operated at room temperature at a high duty cycle, in which square pulses of about 100 nanosecond width are applied at a rate of about 2,000 to 3,000 pulses per second for relatively long periods of time, falls, with few exceptions to half its initial value before about 250 hours of operation have elapsed.

SUMMARY OF THE INVENTION

It has been found that the half-life of a laser diode can be more than doubled if it is fabricated from a body of monocrystalline gallium arsenide produced in accordance with the present novel method. The present method involves the formation of N type, silicon doped monocrystalline gallium arsenide by liquid phase epitaxy on a substrate of gallium arsenide which has a (111)-arsenide face as a seed surface. The improved novel material is gallium arsenide made by this process.

The combination of silicon doping and a (111)-arsenic seed surface appears to be critical. Diodes fabricated from tellurium doped material grown on a (111)-arsenic seed surface have not exhibited the improved lifetime characteristics. It is believed that the other N type dopants e.g. selenium, would likewise fail to produce the improvement.

THE DRAWINGS

Figure 1:
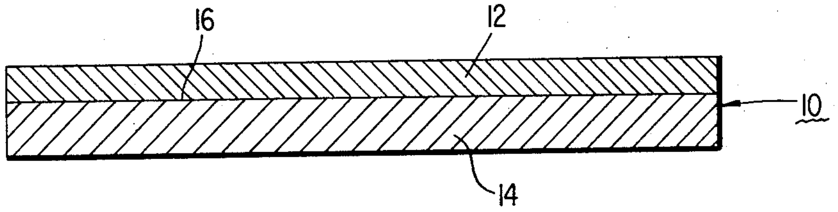
Figure 2:
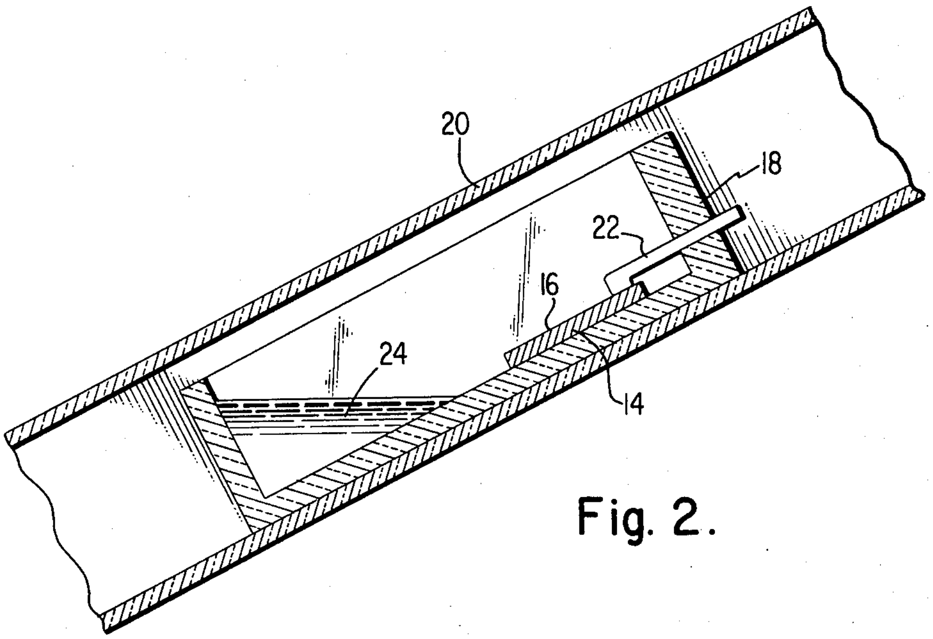

FIG. 1 is cross sectional view of a wafer of gallium arsenide with a portion produced by liquid phase epitaxy; and FIG. 2 is a diagrammatic representation of apparatus in which liquid phase epitaxial growth of gallium arsenide may be carried out.

THE PREFERRED EMBODIMENT

A wafer 10 having a solution grown epitaxial layer 12 formed in accordance with the present novel method is illustrated in FIG. 1. The wafer 10 includes a substrate

14 which has a planar upper surface 16 which is the growth promoting surface of the substrate 14. In the present method, the surface is a (111)-arsenic face of the gallium arsenide material of the substrate 14. The (111)-arsenic face is that (111) face of a gallium arsenide body in which the outermost layer of atoms contains arsenic atoms triply bonded to the lattice of the crystal. The polar nature of gallium arsenide in the (111) direction is well understood in the art. See Gatos et al., "Characteristics of the (111) Surfaces of the 111–V Intermetallic Compounds," Journal of the Electrochemical Society, vol. 107, pp. 427 to 433. The (111)-arsenic face can be identified by known chemical techniques. The layer 12 is doped with silicon to make it N type.

The length, width, and thickness of the substrate 14 are not critical. The substrate 14 may be either P type or N type but in either case it should be lightly doped (less than $1 \times 10^{18}$ cm.$^{-3}$ if N type and less than $1 \times 10^{19}$ cm.$^{-3}$ if P type) and of high crystalline quality.

The epitaxial growth operations are carried out in a manner which has been generally described by this present inventor in an article entitled "Epitaxial Growth of GaAs and Ge from the Liquid State and its Application to the Fabrication of Tunnel and Laser Diodes," RCA Review, vol. 24, pp. 603–615, December 1965. A suitable apparatus for practicing this method is illustrated diagrammatically in FIG. 2. As shown, there is a boat 18, of graphite for example, disposed within a quartz furnace tube 20 which may be heated electrically in a manner well-known in the art. The substrate 14 is disposed within the boat 18 and is held firmly against the floor thereof by means of a clamp indicated diagrammatically at 22. In the lowermost portion of the boat 18, in the tilted condition thereof as shown in FIG. 2, there is a melt 24 which comprises a mixture of gallium arsenide and silicon, in a solvent of gallium. In order to maintain a non-oxidizing atmosphere around the wafer 14, a continuous flow of an inert gas or hydrogen for example, is forced through the furnace tube 20.

With the constituents of the melt 24 and the substrate 14 in place within the boat 18, and with the furnace tube tipped as shown in FIG. 2, the system is heated to a temperature between about 1030° C. and about 1100° C. for N type material. Silicon is amphoteric in gallium arsenide-1 and will impart P type conductivity thereto at lower temperature. As the temperature within the furnace tube rises, the gallium solvent melts and gallium arsenide and silicon particles dissolve in the solvent. When the temperature reaches the preferred temperature, known as the "tip temperature," the heat input is stopped and the furnace tube 20 is tipped so that the melt 24 floods and covers the exposed surface 16 of the substrate wafer 14. At this time, the solvent is nearly saturated with gallium arsenide. As the furnace cools, gallium arsenide initially dissolves from the substrate surface until a solution equilibrium is established. Upon further cooling, precipitation of gallium arsenide from the solution and epitaxial growth upon the substrate occur. After the epitaxial layer is grown to the desired thickness, the furnace tube 20 is tilted back to its original position so as to decant the remaining molten charge from the surface. The graphite boat 18 is then removed from the furnace tube and any remaining portions of the melt 24 are removed from the surface of the epitaxial layer 12.

The cooling rate at which the epitaxial layer 12 is grown is not critical but is preferably between about 4 and about 7° C. per minute in the present method. The cooling rate need not be kept constant during any one cooling cycle but it should be kept within these limits.

The layer 12 is typically about 0.008 inch thick. It may be left on the substrate 14 for further processing or it may be removed therefrom by lapping off the substrate 14 from the side thereof opposite to the layer 12. Preferably, the material remote from the substrate, i.e. the material grown later in the cooling cycle, is removed by lapping to leave only the material which was initially adjacent to the substrate. For example, the layer 12 may be lapped to a thickness of about .004 inch.

Conventional processes may be employed, starting with the present novel material, to form laser diodes having improved operational properties. For example, a P type layer may be grown on a prepared surface of the N type material of the epitaxial layer 12 by a process similar to the one described in the formation of the layer 12, that is, by liquid phase epitaxy from a suitable melt. Thereafter, the resulting wafer may be cleaved, sawed and metallized in known fashion to form suitable laser diodes. Such diodes have been found to have greatly improved operational stability, the power output therefrom remaining above half its initial value for more than 500 hours of operation at room temperature in the so-called high duty cycle. The following table gives examples of particular growth conditions which result in gallium arsenide crystals from which improved laser diodes may be fabricated. The growth promoting surface in all cases is a (111)-arsenic face and the cooling rate in all cases is 4 to 7° C./minute. Example 3 provides the best results.

| Example | Composition of Melt 24 | Tip temperature, ° C. |
|---|---|---|
| 1 | Gallium, 8 g; GaAs, 6 g; Silicon, 0.005 g | 1,100 |
| 2 | Gallium, 8 g; GaAs, 6 g; Silicon, 0.015 g | 1,100 |
| 3 | Gallium, 4.0 g; GaAs, 2.25 g; Silicon, 0.005 g | 1,070 |
| 4 | Gallium, 4.0 g; GaAs, 2.25 g; Silicon, 0.015 g | 1,070 |
| 5 | Gallium, 8 g; GaAs, 4 g; Silicon, 0.005 g | 1,030 |
| 6 | Gallium, 8 g; GaAs, 4 g; Silicon, 0.015 g | 1,030 |

I claim:

1. A method of making a light-emitting diode having improved lifetime characteristics including the steps of:

preparing a melt consisting of gallium arsenide and silicon, in gallium as a solvent therefor, flooding a (111)-arsenic face of a monocrystalline gallium arsenide wafer with said melt at a temperature of about 1030° C. to about 1100° C., and cooling said wafer and said melt at a rate of between approximately 4 and 7° C./minute to provide epitaxial growth of N type monocrystalline gallium arsenide on said (111)-arsenic face.

2. A method as defined in claim 1 wherein the relative proportions of gallium, gallium arsenide, and silicon in said melt, are, by weight, 4.0:2.25:0.005–0.015.

3. A method as defined in claim 1 wherein the relative proportions of gallium, gallium arsenide, and silicon in said melt are, by weight, 4.0:2.25:0.005.

References Cited

UNITED STATES PATENTS

| | | | |
|---|---|---|---|
| 3,387,163 | 6/1968 | Queisser | 317—235 UX |
| 3,440,497 | 4/1969 | Keyes et al. | 317—234 |
| 3,484,713 | 12/1969 | Fenner | 317—235 UX |
| 3,523,045 | 8/1970 | Suzuki et al. | 148—33.1 |

OTHER REFERENCES

Williams, F. V.: Journal Electrochemical Soc., vol. III, No. 7, July 1964, pp. 886–888.

Barber et al.: J. Phys. Chem. Solids, vol. 26, 1965, pp. 1561–1570.

Rupprecht, H.: Proc. of the 1966 Symp. on GaAs, paper No. 9, pp. 57–61 (1966).

Shaw et al.: Proc. of the 1966 Symp. on GaAs, Paper No. 2, pp. 10–15 (1966).

Rupprecht et al.: Applied Physics Letters, vol. 9, No. 6, Sept. 15, 1966, pp. 221–223.

Kressel et al.: J. Applied Physics, vol. 39, No. 4, March 1968, pp. 2006–2011.

L. DEWAYNE RUTLEDGE, Primary Examiner

W. G. SABA, Assistant Examiner

U.S. Cl. X.R.

23—301 SP; 117—201; 148—1.5, 172; 252—62.3 GA; 317—235 N